(12) United States Patent
Kim et al.

(10) Patent No.: US 9,608,015 B2
(45) Date of Patent: Mar. 28, 2017

(54) THIN FILM TRANSISTOR ARRAY PANEL AND MANUFACTURING METHOD THEREOF

(71) Applicant: Samsung Display Co., Ltd., Yongin (KR)

(72) Inventors: Duk-Sung Kim, Asan-si (KR); Sung Man Kim, Seoul (KR); Seung Hyun Park, Seoul (KR); Dae Ho Song, Wanju-gun (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/151,502

(22) Filed: Jan. 9, 2014

(65) Prior Publication Data

US 2015/0053987 A1 Feb. 26, 2015

(30) Foreign Application Priority Data

Aug. 23, 2013 (KR) ........................ 10-2013-0100394

(51) Int. Cl.
*H01L 27/12* (2006.01)
*G02F 1/1343* (2006.01)
*G02F 1/1362* (2006.01)

(52) U.S. Cl.
CPC .... *H01L 27/1262* (2013.01); *G02F 1/134363* (2013.01); *G02F 2001/13625* (2013.01); *G02F 2001/134372* (2013.01); *H01L 27/124* (2013.01)

(58) Field of Classification Search
None
See application file for complete search history.

(56) References Cited

U.S. PATENT DOCUMENTS

| 5,990,987 A | 11/1999 | Tanaka |
| 6,506,617 B1 | 1/2003 | Cheng |
| 7,589,814 B2* | 9/2009 | Kwon ............... G02F 1/134363 349/141 |
| 7,924,386 B2 | 4/2011 | Lee |
| 2010/0001277 A1 | 1/2010 | Jeong et al. |
| 2013/0146900 A1* | 6/2013 | Yeo ..................... H01L 27/1248 257/88 |
| 2014/0247411 A1 | 9/2014 | Kim et al. |

FOREIGN PATENT DOCUMENTS

| KR | 10-2002-0057217 | 7/2002 |
| KR | 10-2007-0072275 | 7/2007 |
| KR | 10-2011-0070564 | 6/2011 |
| KR | 10-2014-0108967 | 9/2014 |

* cited by examiner

*Primary Examiner* — Matthew Reames
*Assistant Examiner* — Steven B Gauthier
(74) *Attorney, Agent, or Firm* — H. C. Park & Associates, PLC

(57) ABSTRACT

Exemplary embodiments of the present disclosure provide a thin film transistor array panel including a first insulating substrate; a gate line and a data line disposed on the first insulating substrate, intersecting with each other, and being insulated from each other; a first passivation layer disposed on the gate line and the data line and comprising a plurality of first openings; a first electrode disposed on the first passivation layer; and a second electrode disposed in the first opening, thereby simplifying a manufacturing process of the thin film transistor array panel.

5 Claims, 49 Drawing Sheets

THIN FILM TRANSISTOR ARRAY PANEL AND MANUFACTURING METHOD THEREOF

CROSS REFERENCE TO RELATED APPLICATION

This application claims priority from and the benefit of Korean Patent Application No. 10-2013-0100394, filed on Aug. 23, 2013, which is hereby incorporated by reference for all purposes as if fully set forth herein.

BACKGROUND

Field

Exemplary embodiments of the present disclosure relate to a thin film transistor array panel and a manufacturing method thereof.

Discussion of the Background

A liquid crystal display (LCD) may have voltages applied to one or more electrodes to realign liquid crystal molecules of a liquid crystal layer, thereby controlling the amount of light transmitted by the LCD.

The liquid crystal display may be slim, but may have poor side visibility relative to a front visibility. To overcome the visibility problem and provide a wide viewing angle, various types of liquid crystal alignments and driving methods are being developed. In order to implement the wide viewing angle, a liquid crystal display in which a second electrode and a first electrode are formed on a single substrate has received attention.

In the case of the liquid crystal display having the above-mentioned form, at least one of the two field generating electrodes (e.g., the second electrode and the first electrode) may have a plurality of cutouts and a plurality of branch electrodes defined by the plurality of cutouts.

When the two field generating electrodes are formed on a single display panel, different photomasks are required to form each of the field generating electrodes, such that the manufacturing cost of the thin film transistor array panel is increased.

The above information disclosed in this Background section is only for enhancement of understanding of the background of the disclosed subject matter and therefore it may contain information that does not form the prior art that is already known to a person of ordinary skill in the art.

SUMMARY

Exemplary embodiments of the present disclosure provide a thin film transistor array panel with lower manufacturing costs, and a manufacturing method thereof.

Additional features of the present disclosure will be set forth in the description which follows, and in part will be apparent from the description, or may be learned by practice of the disclosure.

Exemplary embodiments of the present disclosure provide a thin film transistor array panel including a first insulating substrate, a gate line and a data line disposed on the first insulating substrate. The thin film transistor also includes a first passivation layer disposed on the gate line and the data line and includes a first opening, a first electrode disposed on the first passivation layer, and a second electrode disposed in the first opening.

Exemplary embodiments of the present disclosure also provide a thin film transistor array panel including a first insulating substrate, a gate line and a data line disposed on the first insulating substrate. The thin film transistor also includes a first passivation layer disposed on the gate line and the data line, an organic layer disposed on the first passivation layer, a second passivation layer disposed on the organic layer and including a first opening. The thin film transistor also includes a first electrode disposed on the second passivation layer, and a second electrode disposed in the first opening.

Exemplary embodiments of the present disclosure also provide a manufacturing method of a thin film transistor array panel including forming a gate line on a first insulating substrate, forming a gate insulating layer on the gate line, forming a data line on the gate insulating layer. The manufacturing method of the thin film transistor also includes forming a first insulating layer on the data line, forming a first conductive layer on the first insulating layer, forming a photosensitive film pattern on the first conductive layer, etching the first conductive layer, the first insulating layer, and the gate insulating layer using the photosensitive film pattern as an etching mask, forming a second conductive layer on the photosensitive film pattern, and removing, at least in part, the photosensitive film pattern.

Exemplary embodiments of the present disclosure also provide a manufacturing method of a thin film transistor array panel including forming a gate line on a first insulating substrate, forming a gate insulating layer on the gate line, forming a data line on the gate insulating layer, forming a first insulating layer on the data line. The manufacturing method of a thin film transistor array panel further includes forming an organic layer on the first insulating layer, forming a second insulating layer on the organic layer, forming a first conductive layer on the second insulating layer, forming a photosensitive film pattern on the first conductive layer, etching the first conductive layer, the second insulating layer, and the first insulating layer by using the photosensitive film pattern as a mask, forming a second conductive layer on the photosensitive film pattern, and removing, at least in part, the photosensitive film pattern.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate exemplary embodiments of the disclosure, and together with the description serve to explain the principles of the disclosure.

DETAILED DESCRIPTION OF THE ILLUSTRATED EMBODIMENTS

Figure 1:
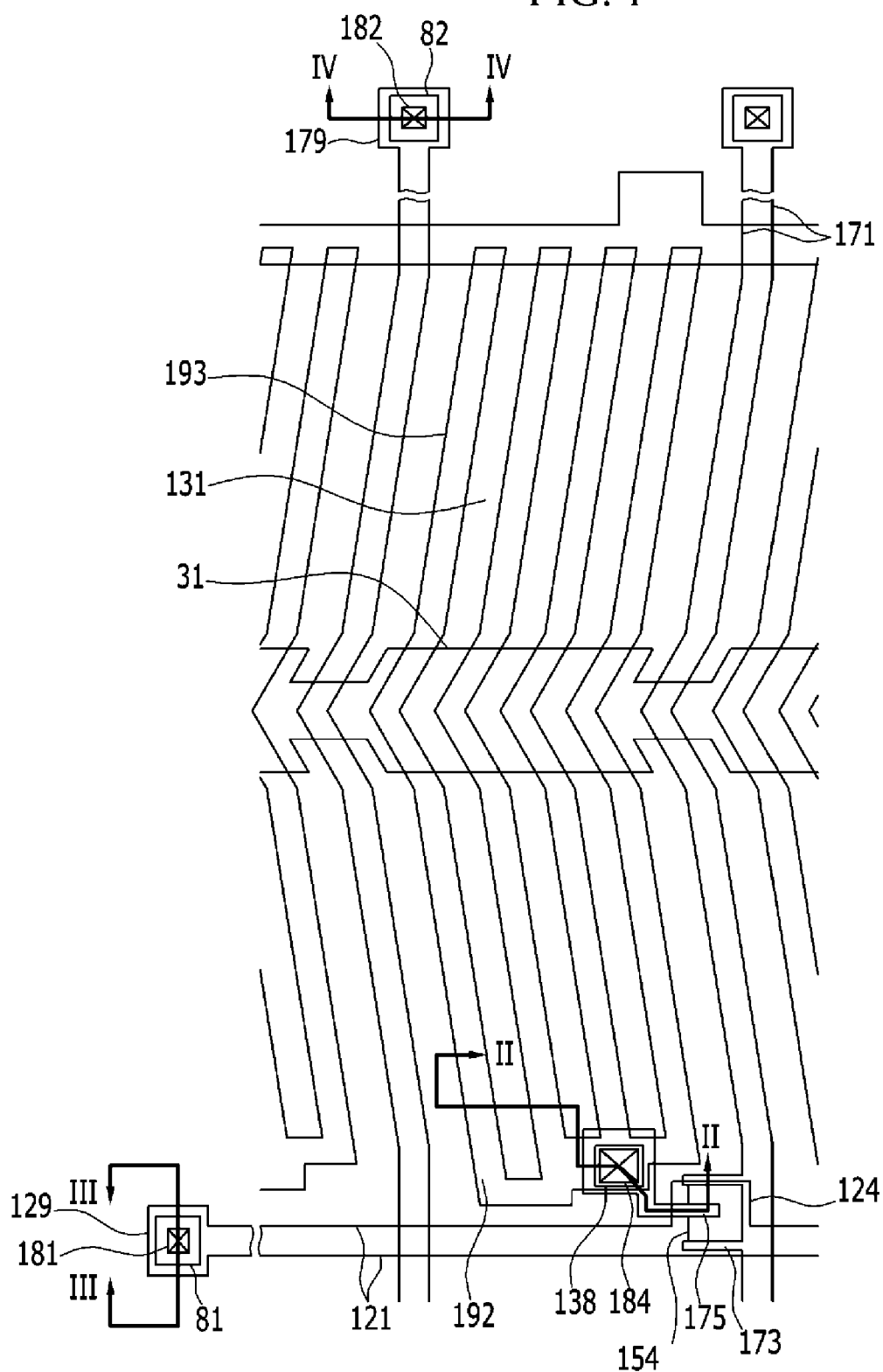
FIG. 1 is a layout view of a thin film transistor array panel according to exemplary embodiments of the present disclosure.

The disclosed subject matter will be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure is thorough, and will fully convey the scope of the disclosure to those skilled in the art. In the drawings, the size and relative sizes of layers and regions may be exaggerated for clarity. Like reference numerals in the drawings denote like elements. As those skilled in the art would realize, the described embodiments may be modified in various different ways, all without departing from the spirit or scope of the present disclosure.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It may also be understood that for the purposes of this disclosure, "at least one of X, Y, and Z" can be construed as X only, Y only, Z only, or any combination of two or more items X, Y, and Z (e.g., XYZ, XYY, YZ, ZZ).

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another region, layer or section. Thus, a first element, component, region, layer, or section discussed below could be termed a second element, component, region, layer, or section without departing from the teachings of the present disclosure.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing exemplary embodiments only and is not intended to be limiting of the disclosed subject matter. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the disclosed subject matter are described herein with reference to cross-section illustrations that are schematic illustrations of idealized embodiments (and intermediate structures) of the disclosed subject matter. As such, variations from the shapes of the illustrations as a result, for example, of manufacturing techniques and/or tolerances, are to be expected. Thus, exemplary embodiments of the disclosed subject matter should not be construed as limited to the particular shapes of regions illustrated herein but are to include deviations in shapes that result, for example, from manufacturing.

Hereinafter, a thin film transistor according to exemplary embodiments of the present disclosure will be described in detail with reference to the accompanying drawings.

Figure 2:
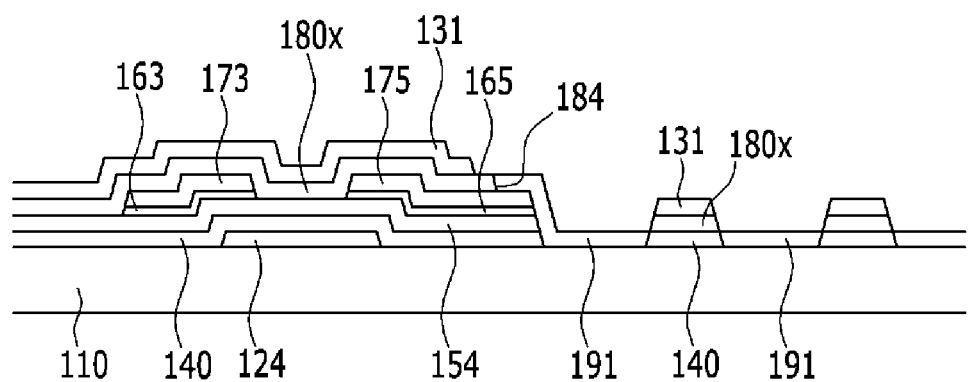
FIG. 2 is a cross-sectional view taken along line II-II of the thin film transistor array panel of FIG. 1.
Figure 3:
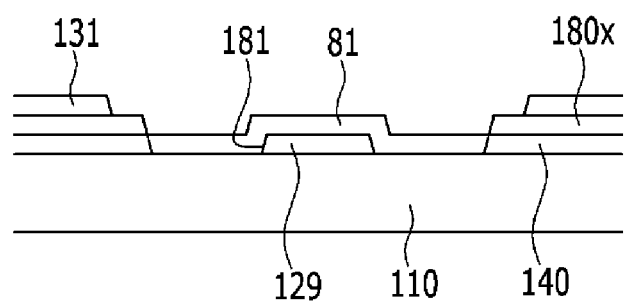
FIG. 3 is a cross-sectional view taken along line III-III of the thin film transistor array panel of FIG. 1.
Figure 4:
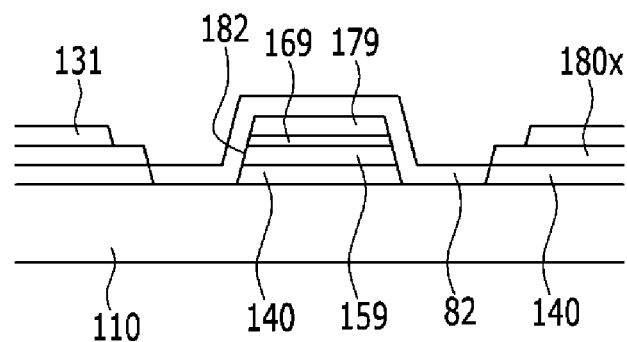
FIG. 4 is a cross-sectional view taken along line IV-IV of the thin film transistor array panel of FIG. 1.
Figure 5:
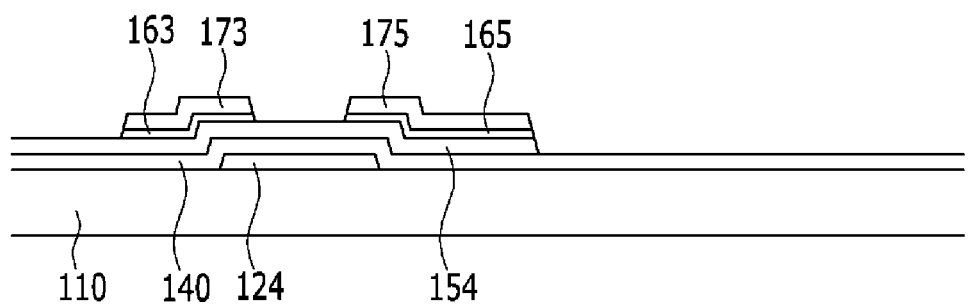
FIG. 5, FIG. 8, FIG. 11, FIG. 14, FIG. 17, and FIG. 20 are cross-sectional views taken along line II-II of FIG. 1 that sequentially illustrate a manufacturing method of the thin film transistor array panel according to the exemplary embodiments of the present disclosure.
Figure 6:
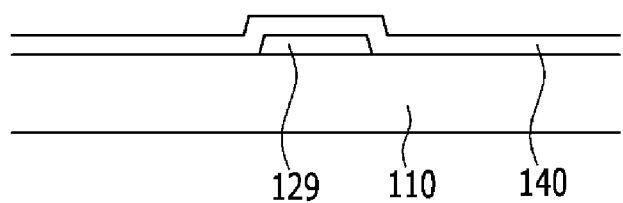
FIG. 6, FIG. 9, FIG. 12, FIG. 15, FIG. 18, and FIG. 21 are cross-sectional views taken along line III-III of FIG. 1 that sequentially illustrate a manufacturing method of the thin film transistor array panel according to the exemplary embodiments of the present disclosure.
Figure 7:
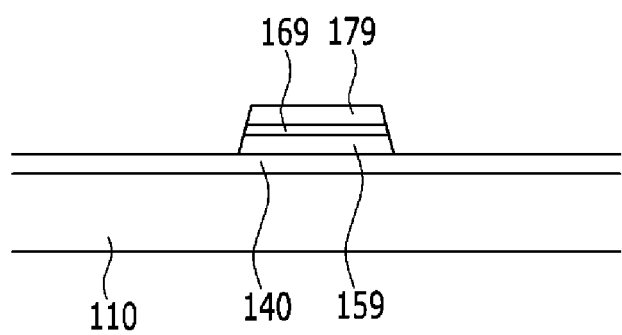
FIG. 7, FIG. 10, FIG. 13, FIG. 16, FIG. 19, and FIG. 22 are cross-sectional views taken along line IV-IV of FIG. 1 that sequentially illustrate a manufacturing method of the thin film transistor array panel according to the exemplary embodiments of the present disclosure.
Figure 8:
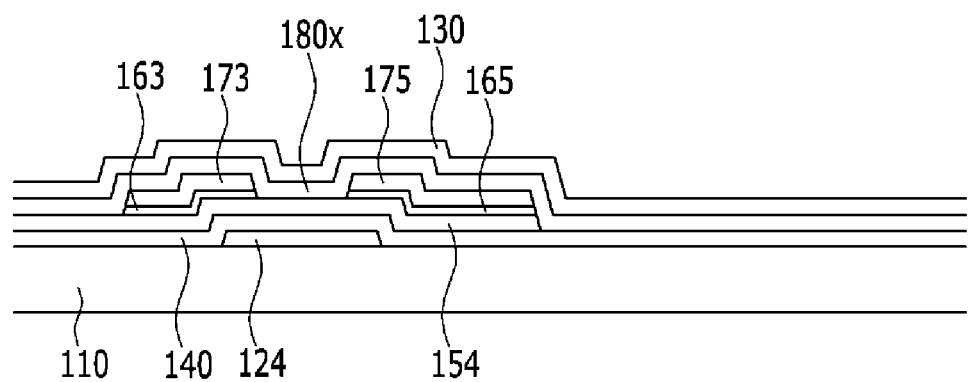
Figure 9:
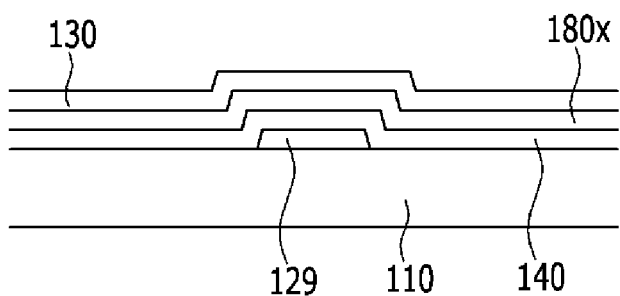
Figure 10:
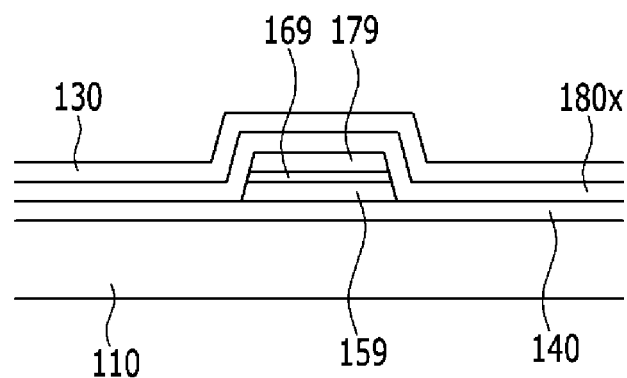

First, the thin film transistor array panel according to the exemplary embodiments of the present disclosure will be described in detail with reference to FIG. 1, FIG. 2, FIG. 3, and FIG. 4. FIG. 1 is a layout view of a thin film transistor array panel. FIG. 2 is a cross-sectional view taken along line II-II of the thin film transistor array panel of FIG. 1. FIG. 3 is a cross-sectional view taken along line III-III of the thin film transistor array panel of FIG. 1. FIG. 4 is a cross-sectional view taken along line IV-IV of the thin film transistor array panel of FIG. 1.

Referring to FIG. 1, FIG. 2, FIG. 3, and FIG. 4, a plurality of gate lines 121 may be formed on a first insulating substrate 110.

Each gate line 121 may include a plurality of gate electrodes 124, which protrude down, and a gate pad part 129, which may have a wide area for connecting with another layer or an external driving circuit. A gate driving circuit (not illustrated), which generates a gate signal, may be mounted on a flexible printed circuit film (not illustrated) that can be attached on the first insulating substrate 110, or the gate driving circuit may be directly mounted on the first insulating substrate 110.

Gate conductors 121, 124, and 129 may be formed as a single layer or as a multilayer, including at least two conductive layers.

A gate insulating layer 140 may be formed on the gate conductors 121, 124, and 129. The gate insulating layer 140 may be made of inorganic insulators, such as silicon nitride (SiNx) and silicon oxide (SiOx).

According to the exemplary embodiments of the present disclosure, a compensation electrode 31 may be selectively provided. The compensation electrode 31 may be positioned parallel to the gate line 121 and, as illustrated in FIG. 1, may, in some cases, be positioned between adjacent gate lines 121. However, the compensation electrode 31 is not limited to this position, and may be positioned in various suitable ways, for example, closer to the two gate lines 121.

The compensation electrode 31 may compensate for the capacitance due to a reduction in the overlapping between a first electrode 131 and a second electrode 191.

A semiconductor 154 may be formed on the gate insulating layer 140. Ohmic contacts 163 and 165 may be disposed on the semiconductor 154.

The semiconductor 154 may include an oxide semiconductor. When the semiconductor 154 is an oxide semiconductor, the ohmic contacts 163 and 165 may be omitted.

A data conductor including a source electrode 173 and a drain electrode 175 may be formed on the ohmic contacts 163 and 165.

The data line 171 may transfer a data signal and may mainly extend in a direction approximately perpendicular to (e.g., crossing) the gate line 121. The data line 171 may include a drain electrode 175 and a data pad part 179, which may have a wide area for connecting with another layer or an external driving circuit. A data driving circuit (not illustrated) for generating a data signal may be mounted on a flexible printed circuit film (not illustrated). The flexible printed circuit film may be attached on the first insulating substrate 110 or may be directly mounted on the first insulating substrate 110.

The drain electrode 175 may include a bar-shaped end facing the source electrode 173 and another end having a wide area, based on the gate electrode 124.

A first semiconductor 159 and a first ohmic contact 169 may be disposed under the data pad part 179. In some cases, the first semiconductor 159 and the first ohmic contact 169 may be omitted.

The data conductors 171, 175, and 179 may be a single layer or may be multilayered, including at least two conductive layers.

The gate electrode 124, the source electrode 173, the drain electrode 175, and the semiconductor 154 may form a thin film transistor (TFT), which may be a switching element. The semiconductor 154 may have substantially the same plane shape as the data conductors 171, 175, and 179, except for a channel portion of the thin film transistor.

A first passivation layer 180x may be positioned on the data conductors 171, 175, and 179. The exposed semiconductor 154 and the first passivation layer 180x may be made of an organic insulating material and/or an inorganic insulating material.

The first passivation layer 180x may include a plurality of first openings. The first openings may be formed to correspond to openings of the gate insulating layer 140.

The first electrode 131 may be disposed on the first passivation layer 180x. The first electrode 131 may be disposed further inside than the first passivation layer 180x during the forming of the first electrode 131, in order to prevent an undercut from occurring.

The first electrode 131 may be made of transparent conductive materials, such as indium tin oxide (ITO) and indium zinc oxide (IZO). The first electrode 131 may be disposed in a display area in which the plurality of pixels is positioned to display an image.

The second electrode 191, a first contact assistant 81, and a second contact assistant 82 may be positioned in the first openings and one or more openings of the gate insulating layer 140. The second electrode 191, the first contact assistant 81, and the second contact assistant 82 may be made of transparent conductive materials, such as ITO and IZO.

The second electrode 191 may be electrically connected to the drain electrode 175 through a first contact hole portion 184 to be applied with a data voltage. The second electrode 191 may include a plurality of branch electrodes 193 that generally extend in parallel with each other and may be spaced apart from each other. The second electrode 191 may also include lower and upper horizontal parts 192 connecting the plurality of branch electrodes 193 to upper and lower ends of the plurality of branch electrodes 193, respectively. The branch electrodes 193 of the second electrode 191 may be bent along the data line 171.

The first contact assistant 81 may be disposed on the gate pad part 129, which is exposed through a second contact hole portion 181. The second contact assistant 82 may be disposed on the data pad part 179, which is exposed through a third contact hole portion 182.

When a data voltage is applied to the second electrode 191 and a common voltage is applied to the first electrode 131, an electric field may be generated in a liquid crystal layer (not illustrated).

In the case of the thin film transistor array panel, a first insulating layer, the first electrode 131, and the second electrode 191 may be formed using one photo mask. Therefore, it may be possible to prevent an increase in the manufacturing cost of a liquid crystal display.

In addition, the first electrode 131 and the second electrode 191 may have the same shape and may be alternately positioned in the thin film transistor array panel.

Next, a manufacturing method of a thin film transistor array panel according to the exemplary embodiments of the present disclosure will be described with reference to FIG. 5, FIG. 6, FIG. 7, FIG. 8, FIG. 9, FIG. 10, FIG. 11, FIG. 12, FIG. 13, FIG. 14, FIG. 15, FIG. 16, FIG. 17, FIG. 18, FIG. 19, FIG. 20, FIG. 21, and FIG. 22 along with FIG. 1, FIG. 2, FIG. 3, and FIG. 4. FIG. 5, FIG. 8, FIG. 11, FIG. 14, FIG. 17, and FIG. 20 are cross-sectional views taken along line II-II of FIG. 1 sequentially illustrating a manufacturing method of the thin film transistor array panel according to the exemplary embodiment of the present disclosure. FIG. 6, FIG. 9, FIG. 12, FIG. 15, FIG. 18, and FIG. 21 are cross-sectional views taken along line III-III of FIG. 1 sequentially illustrating a manufacturing method of the thin film transistor array panel according to the exemplary embodiments of the present disclosure. FIG. 7, FIG. 10, FIG. 13, FIG. 16, FIG. 19, and FIG. 22 are cross-sectional views taken along line IV-IV of FIG. 1 sequentially illustrating a manufacturing method of the thin film transistor array panel according to the exemplary embodiments of the present disclosure.

Referring to FIG. 1, FIG. 5, FIG. 6, and FIG. 7, the gate line 121, the gate electrode 124, and the gate pad part 129 may be formed on the insulating substrate 110, and the gate insulating layer 140 may be disposed on the gate line 121, the gate electrode 124, and the gate pad part 129. The data conductors 171, 175, and 179, which include the semiconductor 154, the first semiconductor 159, the ohmic contacts 163 and 165, the first ohmic contact 169, the data line 171, the drain electrode 175, and the data pad part 179, may be formed on the gate insulating layer 140.

Next, as illustrated in FIG. 1, FIG. 8, FIG. 9, and FIG. 10, the first passivation layer 180x and the first conductive layer 130 may be disposed on the gate insulating layer 140, the data conductors 171, 175, and 179, and the exposed semiconductor 154.

Figure 11:
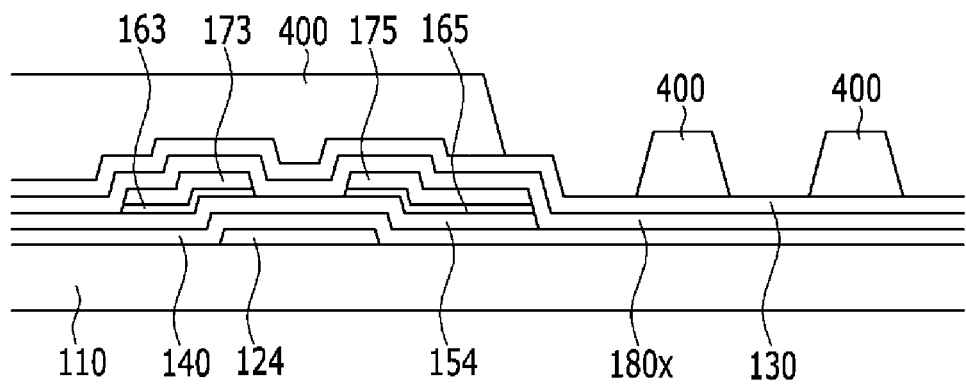
Figure 12:
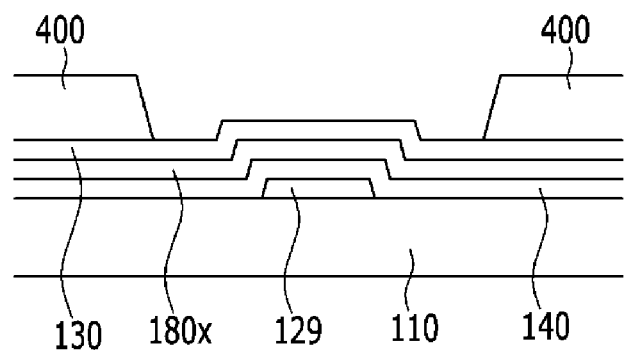
Figure 13:
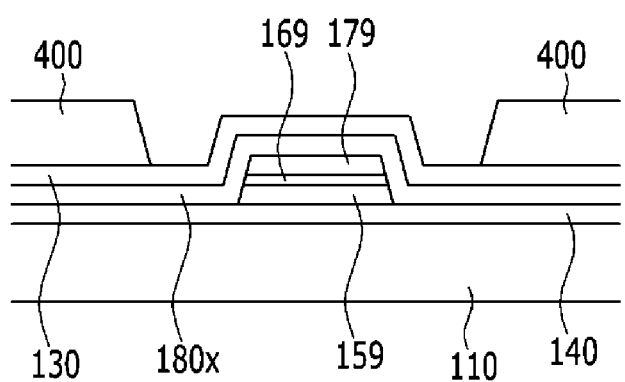

As illustrated in FIG. 11, FIG. 12, and FIG. 13, a photosensitive film pattern 400 may be formed by stacking, exposing, and developing a photosensitive film.

Figure 14:
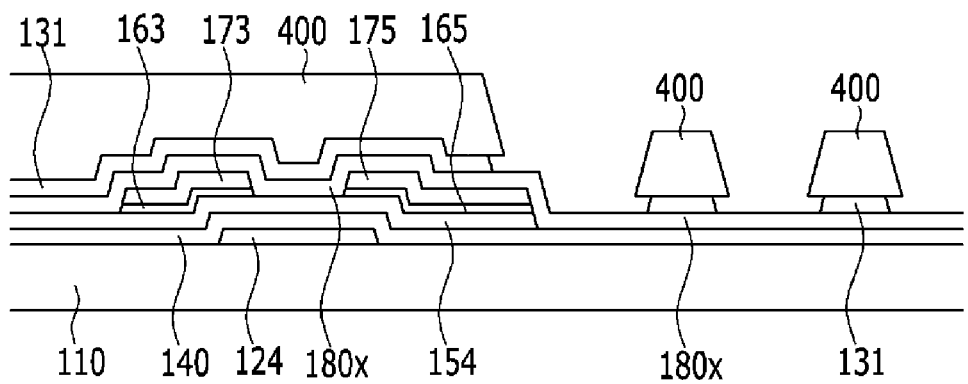
Figure 15:
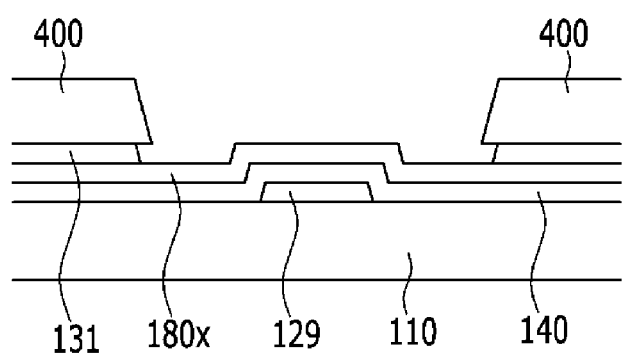
Figure 16:
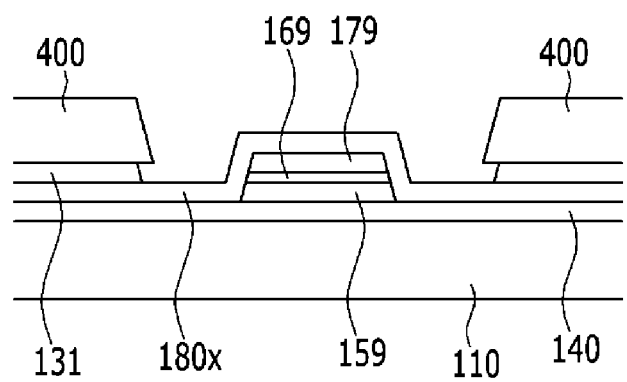

As illustrated in FIG. 14, FIG. 15, and FIG. 16, the first electrode 131 may be formed by etching (e.g., wet etching) the first conductive layer 130 using the photosensitive film pattern 400 as a mask. In this case, the first electrode 131 may form an undercut on the photosensitive film pattern 400.

As illustrated in FIG. 15 and FIG. 16, in the region of the gate pad part 129 and the region of the data pad part 179, the first electrode 131 may be formed by etching the first conductive layer 130.

Figure 17:
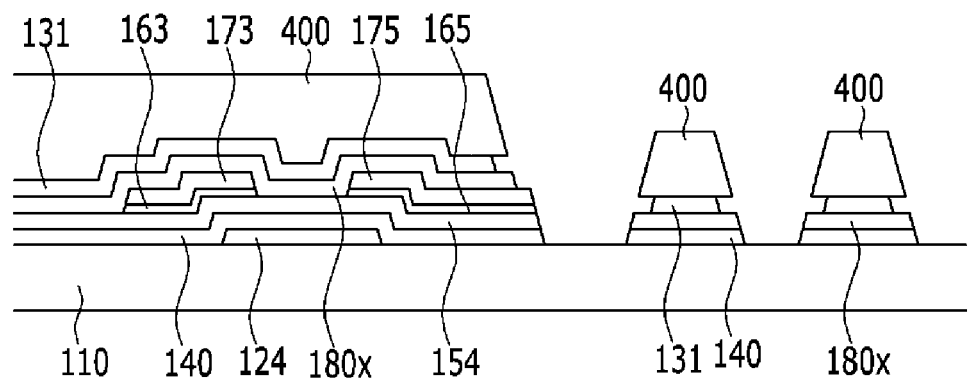
Figure 18:
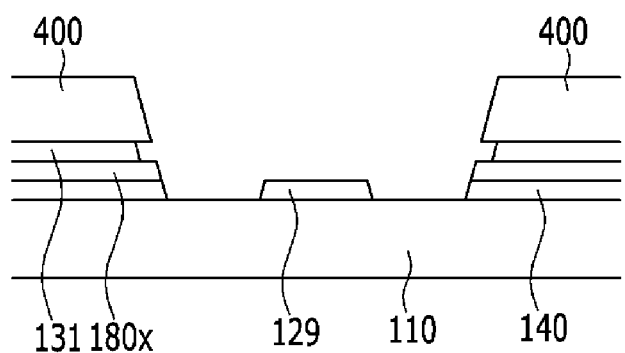
Figure 19:
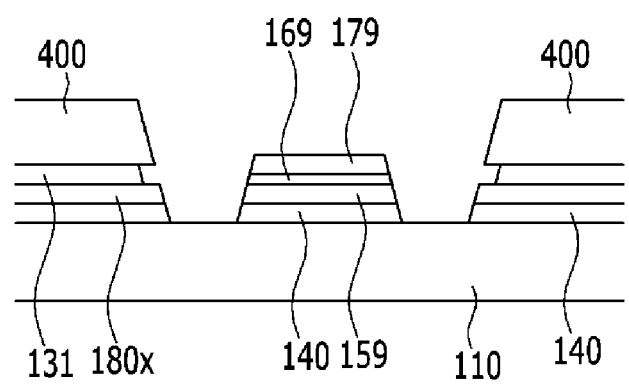

Next, as illustrated in FIG. 17, FIG. 18, and FIG. 19, both of the first passivation layer 180x and the gate insulating layer 140 may be subjected to dry etching by using the first electrode 131 and the photosensitive film pattern 400 as the mask. Therefore, the first passivation layer 180x including the first opening and the gate insulating layer 140 including an opening corresponding to the first opening of the passivation layer 180x may be formed.

In this case, etching of the first passivation layer 180x and the gate insulating layer 140 may result in formation of the second contact hole portion 181, shown in FIG. 1, which may expose the gate pad part 129. Etching of the gate insulating layer 140 and the first passivation layer 180x may result in formation of the third contact hole portion 182, shown in FIG. 1, which may expose the data pad part 179.

Figure 20:
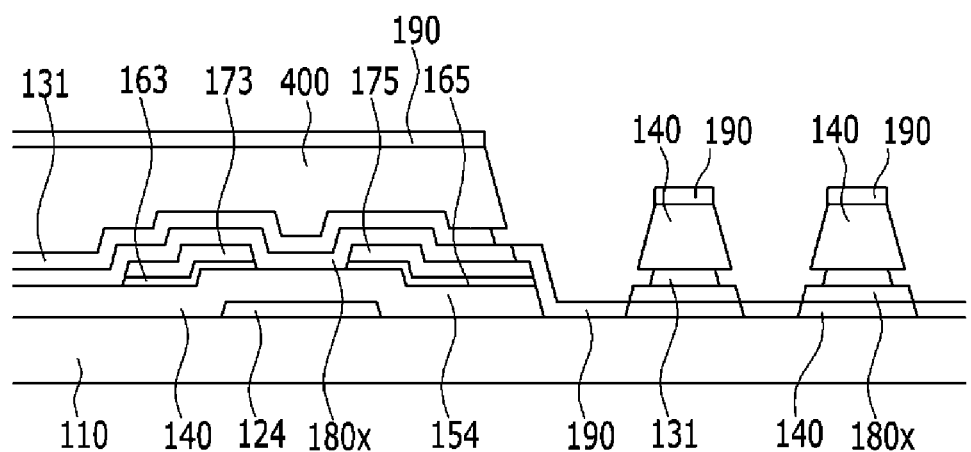
Figure 21:
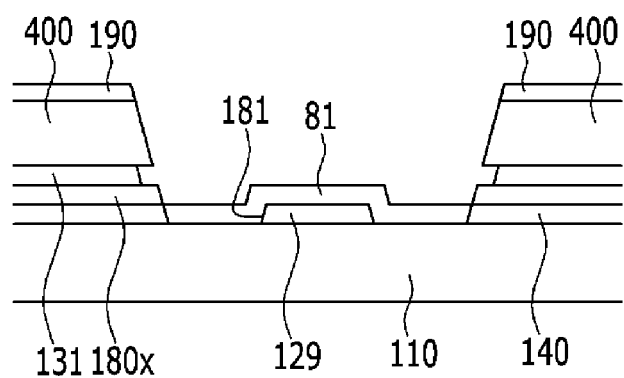
Figure 22:
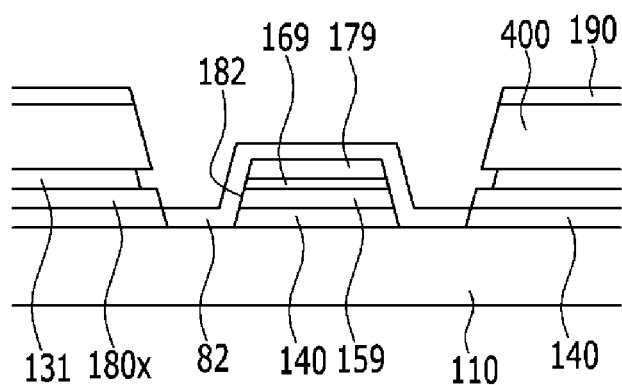

Next, as illustrated in FIG. 20, FIG. 21, and FIG. 22, a second conductive layer 190 may be disposed on the structure illustrated in FIG. 17, FIG. 18, and FIG. 19. The second conductive layer 190 may be partially disposed on the photosensitive film pattern 400 and in the first openings and the openings. The second conductive layer 190 disposed in the first openings and the openings may contact the drain electrode 175 and/or may be disposed on the first insulating substrate 110.

The first contact assistant 81 may contact the gate pad part 129 in the region of the gate pad part 129 and the second contact assistant 82 may contact the data pad part 179 in the region of the data pad part 179.

The photosensitive film pattern 400 that remains may be removed. By the removal, the second conductive layer 190 which is positioned on the photosensitive film pattern 400 may be removed, and only the second conductive layer 190 which contacts the drain electrode 175 or is positioned on the first insulating substrate 110 may remain, thereby forming the second electrode 191. The final structure is illustrated in FIG. 2, FIG. 3, and FIG. 4.

As described above, the second electrode 191 may be electrically connected to the drain electrode 175 through the first contact hole portion 184, and a portion of the second electrode 191 may contact the first insulating substrate 110.

Further, the first contact assistant 81 may be positioned on the gate pad part 129, which is exposed in the region of the second contact hole portion 181, and the second contact assistant 82 may be positioned on the data pad part 179, which is exposed in the region of the third contact hole portion 182.

According to the manufacturing method of the thin film transistor array panel, the first electrode 131, the second electrode 191, and the first passivation layer 180x may be formed together using one photomask. Therefore, it may be possible to prevent an increase in manufacturing costs of a liquid crystal display.

Figure 23:
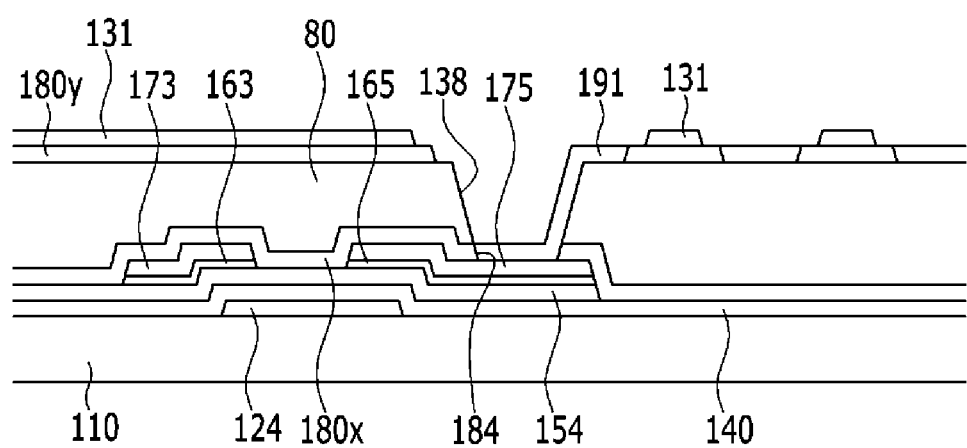
FIG. 23, FIG. 24, and FIG. 25 are cross-sectional views of a portion of a thin film transistor array panel according to exemplary embodiments of the present disclosure.
Figure 24:
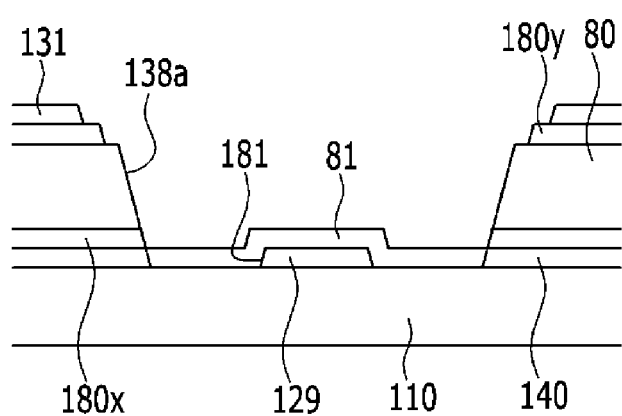
Figure 25:
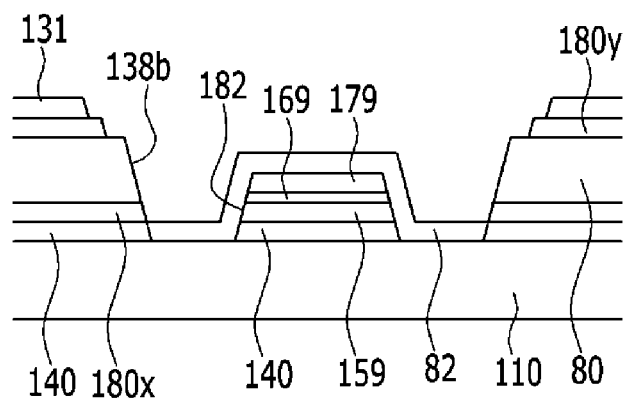
Figure 26:
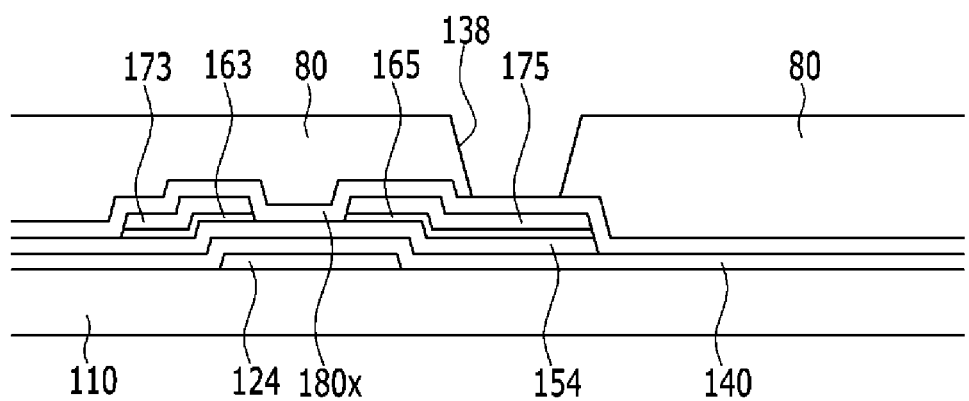
FIG. 26, FIG. 29, FIG. 32, FIG. 35, FIG. 38, and FIG. 41 taken along line II-II of FIG. 1 are cross-sectional views of the thin film transistor array panel according to exemplary embodiments of the present disclosure.
Figure 27:
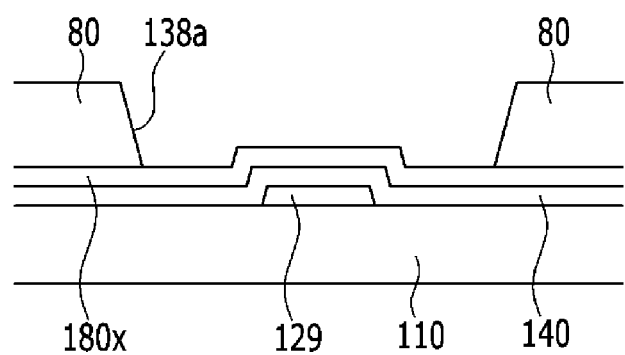
FIG. 27, FIG. 30, FIG. 33, FIG. 36, FIG. 39, and FIG. 42 are cross-sectional views taken along line III-III of FIG. 1 of the thin film transistor array panel according to exemplary embodiments of the present disclosure.
Figure 28:
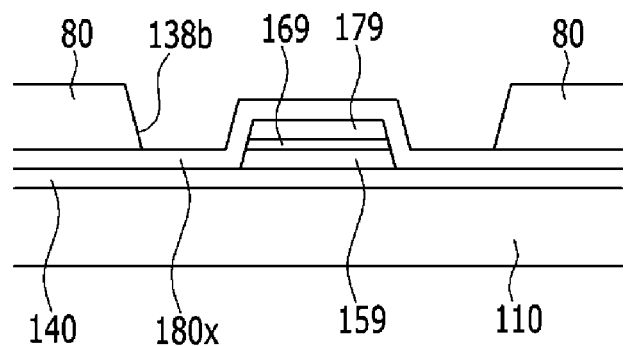
FIG. 28, FIG. 31, FIG. 34, FIG. 37, FIG. 40, and FIG. 43 are cross-sectional views taken along line IV-IV of FIG. 1 of the thin film transistor array panel according to exemplary embodiments of the present disclosure.

Next, a thin film transistor array panel according to exemplary embodiments of the present disclosure will be described in detail with reference to FIG. 23, FIG. 24, and FIG. 25. FIG. 23, FIG. 24, and FIG. 25 are cross-sectional views of a portion of a thin film transistor array panel.

FIGS. 23 to 43 may include some elements similar to or the same as elements in FIGS. 1 to 22. A detailed description of the same elements may be omitted.

An organic layer 80 may be disposed on the first passivation layer 180x. A thickness of the organic layer 80 may be larger than a thickness of the first passivation layer 180x. The organic layer 80 may have a flat surface.

A first contact hole 138 may be formed in the organic layer 80 and the first electrode 131 at a position overlapping a portion of the drain electrode 175.

A second contact hole 138a may be formed in the organic layer 80 at a position overlapping a portion of a region of the gate pad part 129. A third contact hole 138b may be formed at a position overlapping a portion of a region of the data pad part 179.

A second passivation layer 180y and the first electrode 131 may be formed on the organic layer 80. The first electrode 131 may be made of transparent conductive materials such as ITO or IZO, and the second passivation layer 180y may be made of an organic insulating material and/or an inorganic insulating material.

The first electrode 131 may be positioned in a display area in which the plurality of pixels is positioned to display an image.

The first contact hole portion 184 which exposes a portion of the drain electrode 175 may be formed on the first passivation layer 180x. The first contact hole portion 184 may be positioned within the first contact hole 138, which is formed in the organic layer 80 and the first electrode 131.

A second contact hole portion 181 may be formed in the second passivation layer 180y, the first passivation layer 180x, and the gate insulating layer 140 to expose the gate pad part 129. The second contact hole portion 181 may be positioned within the second contact hole 138a, which is formed in the organic layer 80.

A third contact hole portion 182 may be formed in the second passivation layer 180y, the first passivation layer 180x, and the gate insulating layer 140 to expose the data pad part 179. The third contact hole portion 182 may be positioned within the third contact hole 138b, which is formed in the organic layer 80.

The second opening in the second passivation layer 180y may be formed with the second electrode 191, the first contact assistant 81, and the second contact assistant 82. The second electrode 191, the first contact assistant 81, and the second contact assistant 82 may be made of the transparent conductive materials, such as ITO or IZO.

The second electrode 191 may be electrically connected to the drain electrode 175 through the first contact hole portion 184. The second electrode 191 may be applied with a data voltage. The branch electrode 193 of the second electrode 191 may be bent along the data line 171, and the first electrode 131 may also have a corresponding shape.

The first contact assistant 81 may be positioned on the gate pad part 129 which may be exposed through the second contact hole portion 181 and the second contact assistant 82 may be positioned on the data pad part 179 which may be exposed through the third contact hole portion 182.

When the data voltage is applied to the second electrode 191 and a common voltage is applied to the first electrode 131, an electric field may be generated in a liquid crystal layer (not illustrated).

In this example of the thin film transistor array panel, the second passivation layer 180$y$, the first electrode 131, and the second electrode 191 positioned on the organic layer 80 may be formed using one photo mask. Therefore, it is possible to prevent an increase in the manufacturing cost of a liquid crystal display.

Next, a manufacturing method of a thin film transistor array panel will be described in detail with reference to FIG. 23, FIG. 24, and FIG. 25. FIG. 26, FIG. 29, FIG. 32, FIG. 35, FIG. 38, and FIG. 41 are cross-sectional views taken along line II-II of FIG. 1 of the thin film transistor array panel which includes the organic layer according to exemplary embodiments of the present disclosure. FIG. 27, FIG. 30, FIG. 33, FIG. 36, FIG. 39, and FIG. 42 are cross-sectional views taken along line III-III of FIG. 1 of the thin film transistor array panel according to exemplary embodiments of the present disclosure. FIG. 28, FIG. 31, FIG. 34, FIG. 37, FIG. 40, and FIG. 43 are cross-sectional views taken along line IV-IV of FIG. 1 of the thin film transistor array panel according to exemplary embodiments of the present disclosure.

Referring to FIG. 1, FIG. 26, FIG. 27, and FIG. 28, the gate line 121, the gate electrode 124, and the gate pad part 129 may be formed on the insulating substrate 110. The gate insulating layer 140 may be disposed on the gate line 121, the gate electrode 124, and the gate pad part 129. The semiconductor 154, the first semiconductor 159, the ohmic contacts 163 and 165, the first ohmic contact 169, the data line 171, the drain electrode 175, and the data pad part 179 may be formed on the gate insulating layer 140.

The first passivation layer 180$x$ may be disposed on the data line 171, the drain electrode 175, the data pad part 179, and the exposed semiconductor 154. The organic layer 80 may be formed on the first passivation layer 180$x$. A first contact hole 138 may be formed in the organic layer 80 at a position overlapping a portion of the drain electrode 175. A second contact hole 138$a$ may be formed at a position overlapping a portion of a region of the gate pad part 129, and a third contact hole 138$b$ may be formed at a position overlapping a portion of a region of the data pad part 179.

Figure 29:
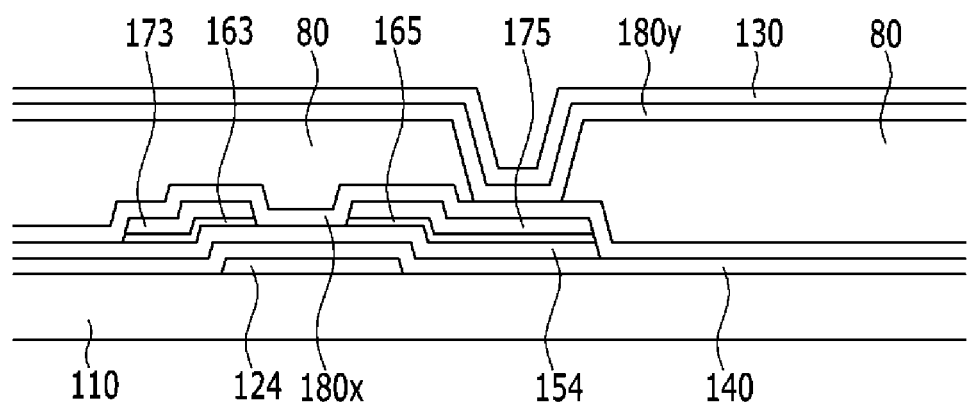
Figure 30:
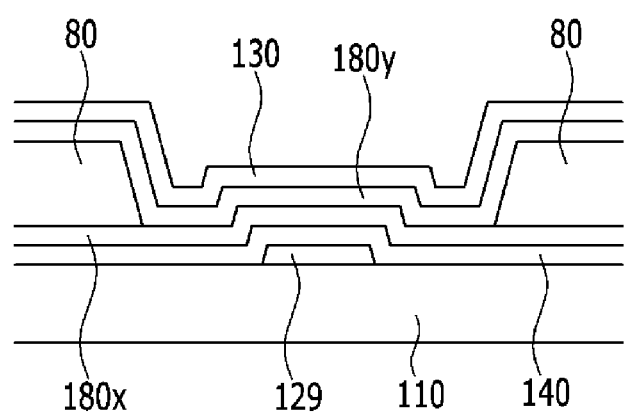
Figure 31:
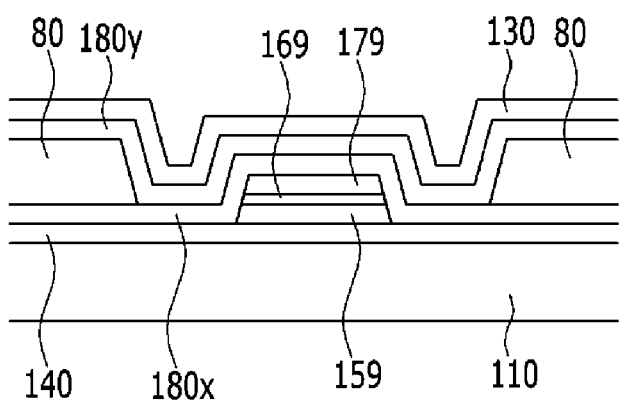

Next, referring to FIG. 29, FIG. 30, and FIG. 31, the second passivation layer 180$y$ and the first conductive layer 130 may be disposed on the organic layer 80 and in the contact hole from which the organic layer 80 is removed.

Figure 32:
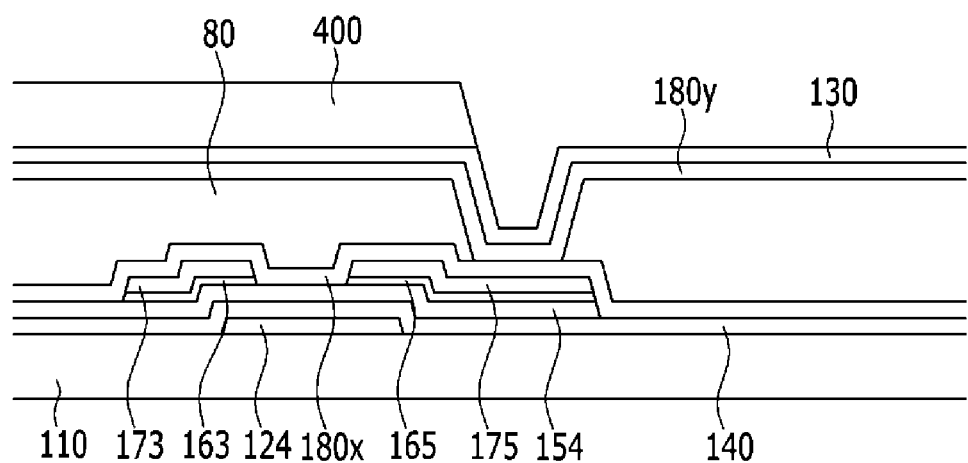
Figure 33:
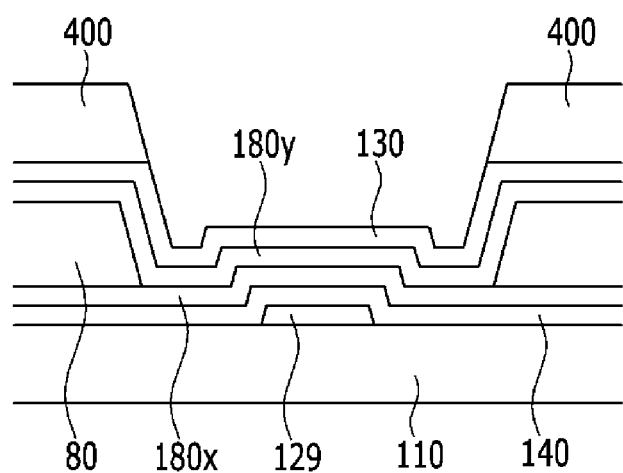
Figure 34:
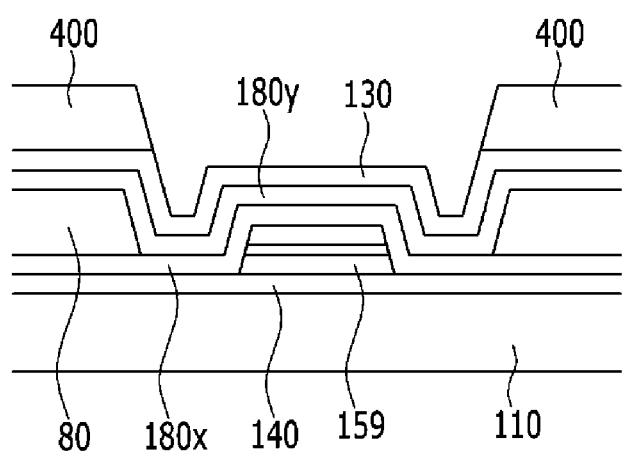

Next, as illustrated in FIG. 32, FIG. 33, and FIG. 34, the photosensitive film pattern 400 may be formed by disposing, exposing, and developing a photosensitive film.

Figure 35:
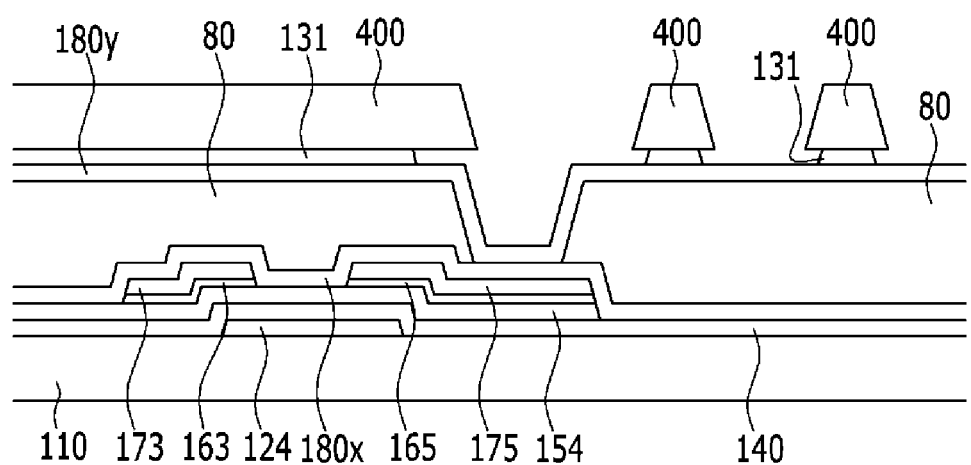
Figure 36:
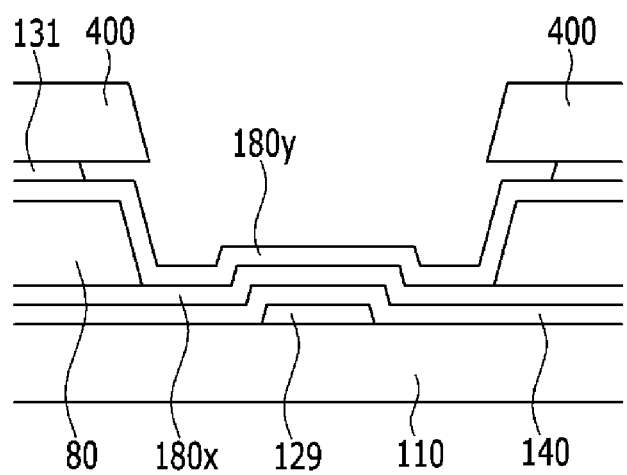
Figure 37:
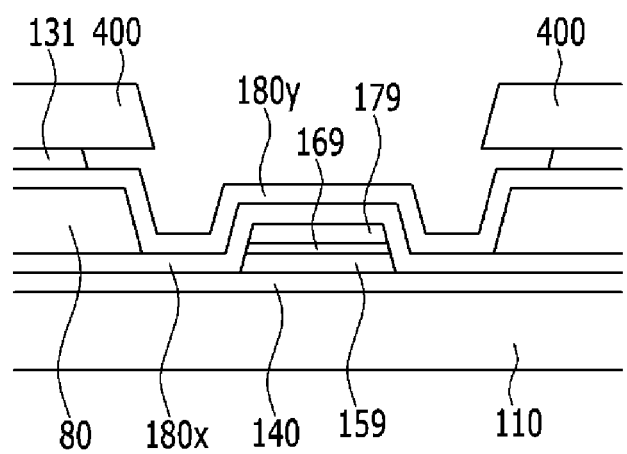

Next, as illustrated in FIG. 35, FIG. 36, and FIG. 37, the first electrode 131 may be formed by performing the wet etching the first conductive layer 130 using the photosensitive film pattern 400 as the mask.

Figure 38:
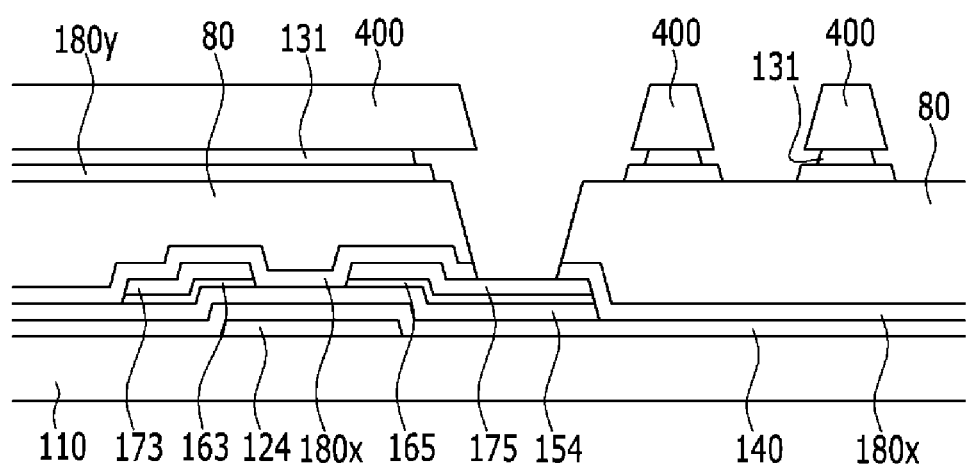
Figure 39:
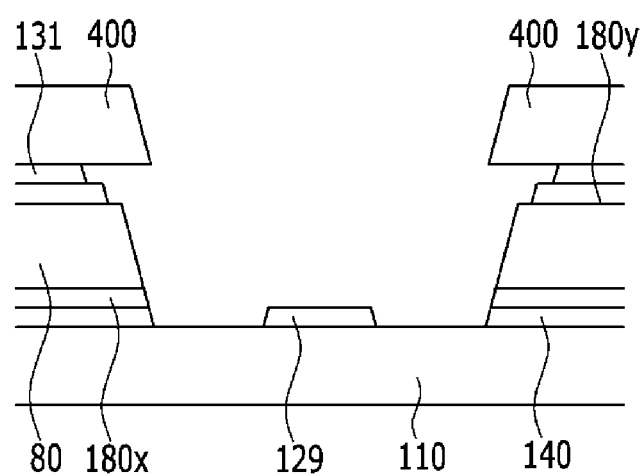
Figure 40:
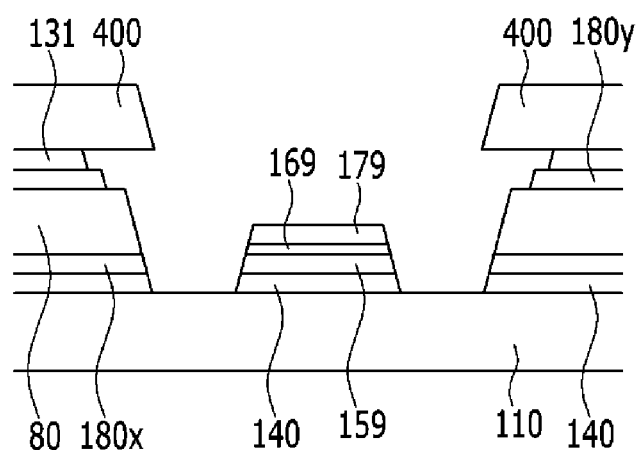

Referring to FIG. 38, FIG. 39, and FIG. 40, the second passivation layer 180$y$ and the first passivation layer 180$x$ may be simultaneously subjected to dry etching by using the first electrode 131 and the photosensitive film pattern 400 as the mask, thereby forming a second opening and a first opening corresponding to contact holes of the organic layer 80. The gate insulating layer 140 may be etched to form a corresponding opening by the dry etching.

The second passivation layer 180$y$ may be formed in a pixel area and may further include the second opening for forming patterned first and second electrodes.

Figure 41:
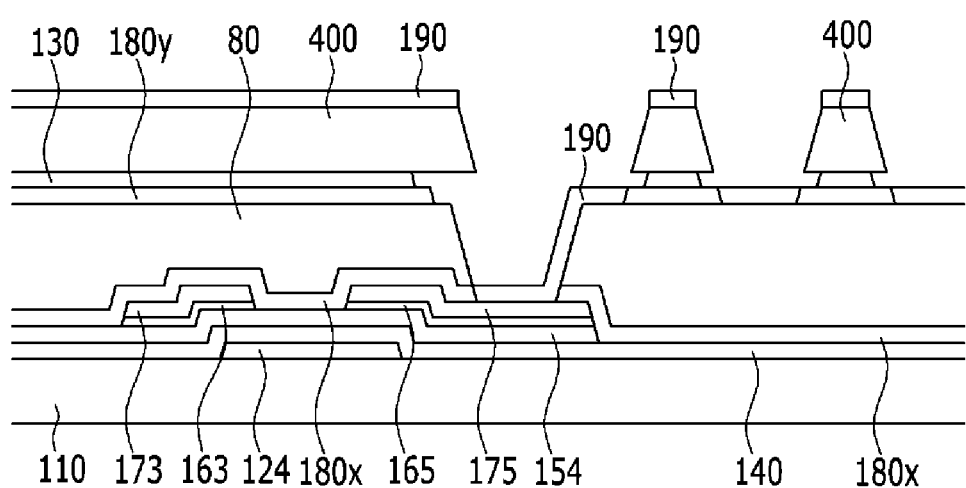
Figure 42:
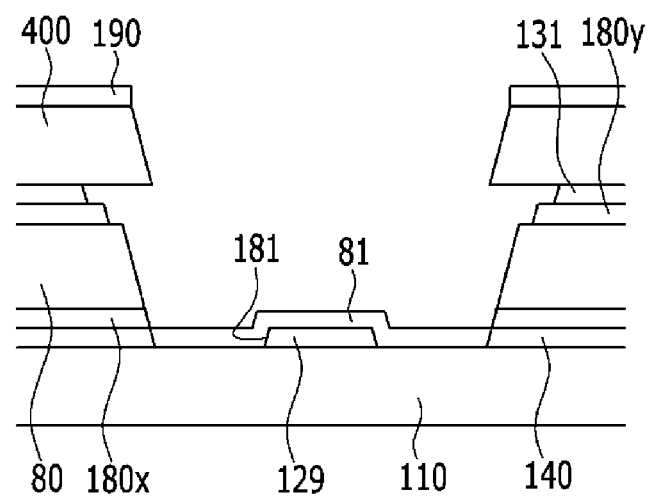
Figure 43:
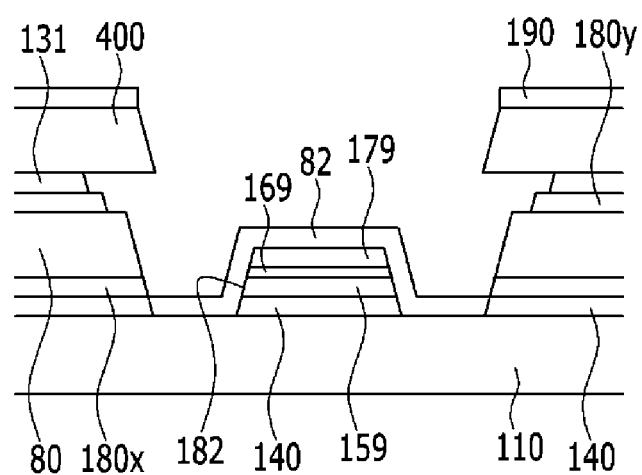

As illustrated in FIG. 41, FIG. 42, and FIG. 43, the second conductive layer 190 may be formed. In this case, the second conductive layer 190 may be partially positioned on the photosensitive film pattern 400 and may be partially disposed in the first and second openings. The second conductive layer 190 disposed in the first opening and the second opening may contact the drain electrode 175 or may be positioned on the organic layer 80.

The first contract assistant 81 may contact the gate pad part 129 in the region of the gate pad part 129, and the second contract assistant 82 may contact the data pad part 179 in the region of the data pad part 179.

Next, the formed photosensitive film pattern 400 may be removed. By the removal of the photosensitive film pattern 400, the second conductive layer 190 which is positioned on the photosensitive film pattern 400 may be removed, and only the second conductive layer 190 which contacts the drain electrode 175 or is positioned on the organic layer 80 may remain, thereby forming the second electrode 191. The final structure is illustrated in FIG. 23, FIG. 24, and FIG. 25.

As described above, the second electrode 191 may be electrically connected to the drain electrode 175 through the first contact hole portion 184, and a portion of the second electrode 191 may contact the organic layer 80.

The first contact assistant 81 may be positioned on the gate pad part 129, which is exposed through the second contact hole portion 181. The second contact assistant 82 may be positioned on the data pad part 179, which is exposed through the third contact hole portion 182.

According to the manufacturing method of the thin film transistor array panel, the first electrode 131, the second electrode 191, and the second passivation layer 180$y$ may be formed together using one photomask. Therefore, it is possible to prevent an increase in the manufacturing cost of a liquid crystal display.

Figure 44:
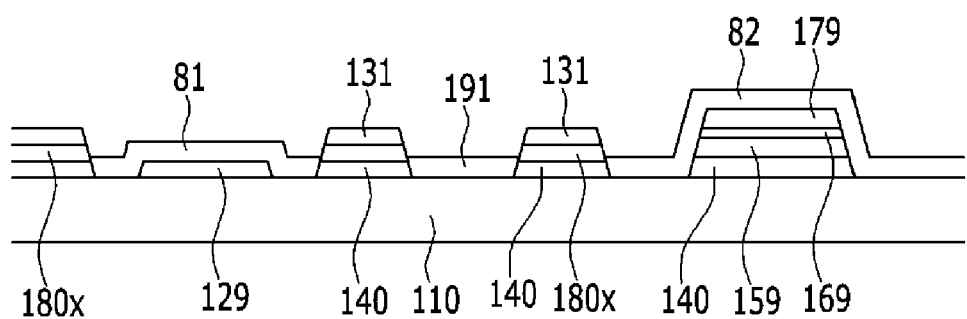
FIG. 44 is a cross-sectional view of a portion of a thin film transistor array panel according to exemplary embodiments of the present disclosure.
Figure 45:
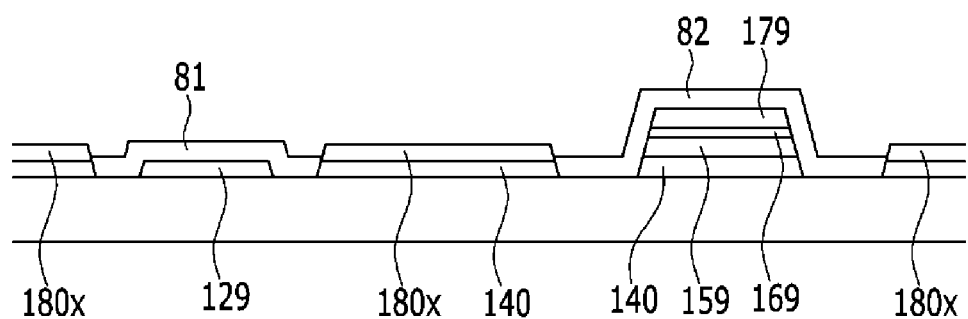
FIG. 45 is a cross-sectional view of a portion of a thin film transistor array panel according to exemplary embodiments of the present disclosure.

Hereinafter, a thin film transistor array panel according to exemplary embodiments of the present disclosure will be described. FIG. 44 is a cross-sectional view of a portion of a thin film transistor array panel. FIG. 45 is a cross-sectional view of a portion of a thin film transistor array panel. FIGS. 44 to 50 may include some elements similar to or the same as elements in FIGS. 1 to 43. A detailed description of the same elements may be omitted FIG. 44 is an exemplary embodiment in which the organic layer 80 is not present and illustrates cross sections of the region of the gate pad part 129 and the region of the data pad part 179.

The opening of the gate insulating layer 140 and the first opening of the first passivation layer 180$x$ corresponding to the opening of the gate insulating layer 140 may be formed around the gate pad part 129 and the data pad part 179. The first electrode 131 or the second electrode 191 may be disconnected to prevent a short between the respective pad parts 129 and 179. The present disclosure illustrates only a structure of a non-organic layer for a liquid crystal display, but is not limited thereto. An organic layer and various other suitable materials may also be used.

FIG. 45 illustrates an exemplary embodiment having another structure for preventing a short between the pad parts 129 and 179.

The first electrode 131, shown in FIG. 1, is positioned on the first passivation layer 180x between the gate pad part 129 and the data pad part 179, and may be removed using a separate mask.

Since the first electrode 131 is removed, the risk of a short is removed. The first electrode 131 positioned in a transistor region may also be removed during the removal of the first electrode 131. FIG. 45 illustrates a thin film transistor array panel that does not include an organic layer 80, but the present disclosure is not limited thereto, and may also be used in a thin film transistor array panel including an organic layer 80.

Figure 46:
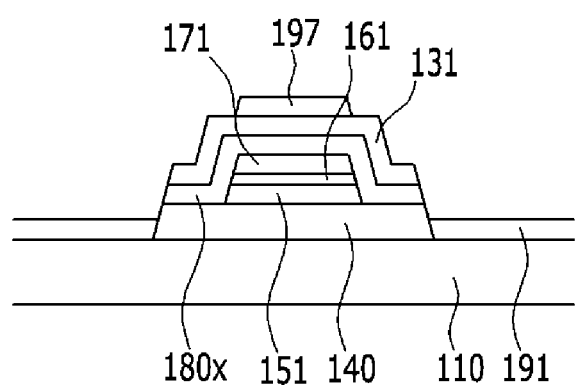
FIG. 46 is a cross-sectional view of a data line of a thin film transistor array panel according to exemplary embodiments of the present disclosure.
Figure 47:
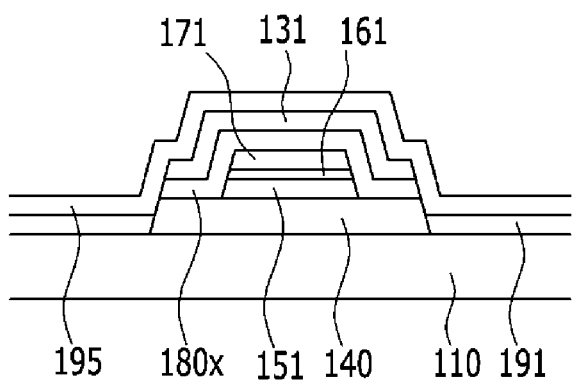
FIG. 47, FIG. 48, and FIG. 49 are cross-sectional views of a manufacturing method for forming the data line of FIG. 46 according to exemplary embodiments of the present disclosure.
Figure 48:
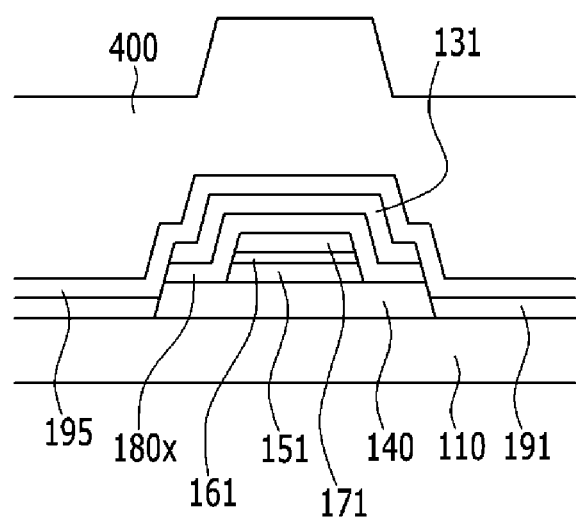
Figure 49:
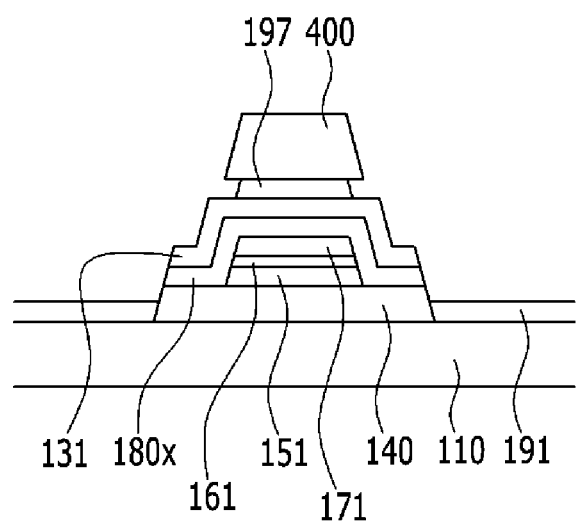

Hereinafter, a thin film transistor array panel and a manufacturing method thereof according to exemplary embodiments of the present disclosure will be described. FIG. 46 is a cross-sectional view of a data line of a thin film transistor array panel. FIG. 47, FIG. 48, FIG. 49 are cross-sectional views of a manufacturing method for forming the data line of FIG. 46.

FIG. 46 is a cross-sectional view of a thin film transistor array panel including a data line 171 and a metal layer 197 disposed on the first electrode 131. The metal layer 197 may be made of any metal (e.g., molybdenum (Mo)) configured to reduce a wire resistance of the first electrode 131.

A manufacturing process of the thin film transistor array panel of FIG. 46 will be described with reference to FIG. 47, FIG. 48, and FIG. 49. Referring to FIG. 47, a metal 195 for reducing the wire resistance of the first electrode 131 may be disposed on an end surface of the data line 171. The thin film transistor array panel of FIGS. 46 and 47 may not include an organic layer 80.

Next, as illustrated in FIG. 48, a non-half tone mask may be used in the data line 171, and the photosensitive film pattern 400 may be formed in a peripheral region of the data line 171, for example, a region in which the metal layer 197, shown in FIG. 46 is unnecessary, by using a half tone mask Next, etching, as illustrated in FIG. 49 may be performed by wet etching portions of the photosensitive film pattern 400. After the wet etching, the metal layer 197 may remain only on the data line 171.

The present disclosure separately describes and illustrates the thin film transistor array panel of FIG. 46 and the thin film transistor array panel of FIG. 45, but the metal layer 197 may be formed while removing the first electrode 131, by using one mask.

Although not illustrated separately, in order to control an undercut of the first passivation layer 180x in the thin film transistor array panel including an inorganic layer or an organic layer, the photosensitive film pattern 400 including the half tone region may be used, in which the half tone region is formed to overlap the drain electrode 175 shown in FIG. 1.

In detail, after the first passivation layer 180x and the gate insulating layer 140 are etched by using the photosensitive film pattern 400 including the half tone region, the etching may be performed once again by removing the photosensitive film pattern 400 of the half tone region. In this case, the photosensitive film pattern 400 of the half tone region may be removed, and thus the electrode and the gate insulating layer 140 covering the drain electrode 175 may be removed, such that it may be possible to prevent an undercut from being formed by performing the etching two times.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. A thin film transistor array panel, comprising:
a first insulating substrate;
a gate line and a data line disposed on the first insulating substrate;
a first passivation layer disposed on the gate line and the data line, the first passivation layer comprising a first opening;
a first electrode disposed on the first passivation layer;
a second electrode disposed in the first opening;
an insulating layer comprising a gate insulating portion disposed on the gate line; and
a recess formed in the first passivation layer and the insulating layer,
wherein the gate line comprises a gate pad part disposed in the recess, the gate pad part being spaced apart from the first passivation layer and the insulating layer such that the gate pad part does not physically contact the first passivation layer or the insulating layer.

2. The thin film transistor array panel of claim 1, wherein:
a portion of the second electrode contacts the first insulating substrate.

3. The thin film transistor array panel of claim 1, further comprising:
a thin film transistor connected to the gate line and the data line.

4. The thin film transistor array panel of claim 1, wherein:
the data line comprises a data pad part; and
the first opening is disposed on the gate pad part and the data pad part.

5. The thin film transistor array panel of claim 1, further comprising:
a metal layer disposed on a portion of the data line.

* * * * *